(12) United States Patent
Sonoda et al.

(10) Patent No.: US 10,217,957 B2
(45) Date of Patent: Feb. 26, 2019

(54) ORGANIC EL DISPLAY DEVICE AND METHOD OF MANUFACTURING ORGANIC EL DISPLAY DEVICE

(71) Applicant: Sharp Kabushiki Kaisha, Sakai, Osaka (JP)

(72) Inventors: Tohru Sonoda, Sakai (JP); Takashi Ochi, Sakai (JP); Hisao Ochi, Sakai (JP); Tohru Senoo, Sakai (JP); Takeshi Hirase, Sakai (JP); Akihiro Matsui, Sakai (JP); Jumpei Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/065,853

(22) PCT Filed: Oct. 13, 2016

(86) PCT No.: PCT/JP2016/080434
§ 371 (c)(1),
(2) Date: Jun. 25, 2018

(87) PCT Pub. No.: WO2018/070027
PCT Pub. Date: Apr. 19, 2018

(65) Prior Publication Data
US 2019/0013493 A1    Jan. 10, 2019

(51) Int. Cl.
*H01L 51/00* (2006.01)
*H01L 51/52* (2006.01)
(Continued)

(52) U.S. Cl.
CPC ........ *H01L 51/524* (2013.01); *H01L 51/5253* (2013.01); *H01L 51/56* (2013.01);
(Continued)

(58) Field of Classification Search
CPC ... H01L 51/524; H01L 51/5253; H01L 51/56; H01L 27/3244; H01L 27/323; H01L 2251/5338
(Continued)

(56) References Cited

U.S. PATENT DOCUMENTS

2006/0202206 A1    9/2006    Koyama et al.
2008/0055831 A1    3/2008    Satoh
(Continued)

FOREIGN PATENT DOCUMENTS

JP    2006-270077 A    10/2006
JP    2010-282181 A    12/2010
(Continued)

OTHER PUBLICATIONS

Official Communication issued in International Patent Application No. PCT/JP2016/080434, dated Jan. 17, 2017.

*Primary Examiner* — Long K Tran
(74) *Attorney, Agent, or Firm* — Keating & Bennett, LLP

(57) ABSTRACT

An organic EL display device includes: a first support member having flexibility; an organic EL layer layered in a matrix form on the first support member; and a second support member disposed opposite the first support member with the organic EL layer interposed between the first support member and the second support member. Grooves on the first support member and grooves on the second support member overlap with one another. As a result, flexibility of the organic EL display device can be enhanced.

6 Claims, 10 Drawing Sheets

(51) Int. Cl.
*H01L 51/56* (2006.01)
*H01L 27/32* (2006.01)

(52) U.S. Cl.
CPC .... *H01L 27/3244* (2013.01); *H01L 2227/323* (2013.01); *H01L 2251/5338* (2013.01)

(58) Field of Classification Search
USPC .......................................................... 257/40
See application file for complete search history.

(56) References Cited

U.S. PATENT DOCUMENTS

| | | | |
|---|---|---|---|
| 2010/0277443 A1 | 11/2010 | Yamazaki et al. | |
| 2014/0306213 A1* | 10/2014 | Sato | H01L 51/5275 257/40 |
| 2015/0034936 A1* | 2/2015 | Fukunaga | H01L 51/0097 257/40 |

FOREIGN PATENT DOCUMENTS

| | | |
|---|---|---|
| JP | 4777338 B2 | 9/2011 |
| JP | 2016-091948 A | 5/2016 |

* cited by examiner

ORGANIC EL DISPLAY DEVICE AND METHOD OF MANUFACTURING ORGANIC EL DISPLAY DEVICE

TECHNICAL FIELD

The disclosure relates to an organic EL display device and a method of manufacturing an organic EL display device.

BACKGROUND ART

Flexible image display devices that can be curved have been developed in the field of display devices such as organic EL display devices.

PTL 1 discloses a flexible image display device including an organic EL element sandwiched between a transparent film and a flexible base material. In the flexible image display device, concave-convex portions are formed on outside surfaces of the transparent film and the flexible base material.

When the flexible image display device is curved, the convex portions on the curved inside, among the concave-convex portions on the outside surfaces of the transparent film and the flexible base material, come into contact with one another and interfere with one another. As a result, excessive curving of the flexible image display device is restricted, and damage to the organic EL element is prevented.

CITATION LIST

Patent Literature

PTL 1: JP 4777338 B

SUMMARY

Technical Problem

In recent years, an organic EL display device including a sealing layer configured to seal an organic EL element and formed by using thin film encapsulation technology have been developed to achieve even thinner films.

A moisture prevention layer and the sealing layer formed to prevent ingress of moisture and oxygen to the organic EL element, and the organic EL element are vulnerable to external force, and it is necessary to minimize application of bending stresses as much as possible when a flexible image display device is bent. Therefore, a neutral plane is desirably disposed at or near a region from the moisture prevention layer to the sealing layer (the organic EL layer is encapsulated between the moisture prevention layer and the sealing layer) formed on a substrate. The neutral plane is a plane that is neither extended nor compressed when the plane is bent, and the neutral plane is determined by the order of layered layers, Young's moduli of the layered layers, and the thicknesses of the layered layers.

In the flexible image display device of PTL 1, when the concave-convex portions are formed on the outside surface only on one side of the transparent film or the flexible base material, the above-described neutral plane may move from a desired position. As the deviation from the neutral plane increases, the bending strain increases. Therefore, when the neutral plane moves from the above-described position, the bending strain increases in the moisture prevention layer, the sealing layer or the organic EL element, and there is a concern of occurrence of cracking or film separation.

Even when the film thickness and elasticity of the transparent film or the flexible substrate are controlled in consideration of the concave-convex portions formed on the transparent film, and the neutral plane is maintained at or near the moisture prevention layer, the sealing layer or the organic EL element, plastic deformation of the flexible substrate occurs due to the bending strain generated on the surface of the flexible substrate including no concave-convex portions.

On the other hand, as illustrated in FIG. 10D of PTL 1, in a case where a structure is made by providing the concave-convex portions on both the surfaces of the transparent film and the flexible substrate and by sandwiching the organic EL element between the surfaces in a concave-convex shape, a problem also occurs in flexibility when positions of grooves of the concave-convex portions do not match one another.

In other words, when the positions of the grooves of the concave-convex portions do not match one another, the position of the neutral plane changes at portions of the grooves, and the bending strain increases in the moisture prevention layer, the sealing layer or the organic EL element. Therefore, there is a high concern of occurrence of cracking or film separation at the moisture prevention layer, the sealing layer or the organic EL element.

The disclosure is made in view of the above problem of the known technology, and it is an object of the disclosure to achieve both flexibility and shock resistance of an organic EL display device.

Solution to Problem

To solve the above problem, an organic EL display device according to one aspect of the disclosure includes: a first support member having flexibility; an organic EL layer formed in a matrix form on the first support member; and a second support member having flexibility and disposed opposite the first support member with the organic EL layer interposed between the first support member and the second support member. In the organic EL display device, the first support member and the second support member each include an outside surface on which a plurality of bulging portions is formed, and grooves between the bulging portions of the first support member and grooves between the bulging portions of the second support member overlap with one another.

To solve the above problem, a method of manufacturing an organic EL display device according to one aspect of the disclosure includes disposing a first support member and a second support member each having flexibility, opposite each other with an organic EL layer formed in a matrix form and interposed between the first support member and the second support member. In the disposing a first support member and a second support member, a plurality of bulging portions formed on one surface of the first support member and a plurality of bulging portions formed on one surface of the second support member each face toward the outside, and the first support member and the second support member are disposed opposite each other with grooves formed between the bulging portions of the first support member and grooves formed between the bulging portions of the second support member overlapping with one another.

To solve the above problem, an organic EL display device according to one aspect of the disclosure includes: a support member having flexibility; an organic EL layer formed in a matrix form on the support member; and a sealing layer formed on the support member and configured to seal the organic EL layer. In the organic EL display device, the support member and the sealing layer each include an outside surface on which a plurality of bulging portions is formed, and grooves between the bulging portions of the support member and grooves between the bulging portions of the sealing layer overlap with one another.

Advantageous Effects of Disclosure

According to one aspect of the disclosure, both flexibility and shock resistance can be achieved in a thin film encapsulated organic EL display device.

DESCRIPTION OF EMBODIMENTS

First Embodiment

Schematic Configuration of Organic EL Display Device 1

First, a schematic configuration of an organic EL display device 1 according to a first embodiment of the disclosure will be described with reference to FIGS. 1 to 3B.

Figure 1:
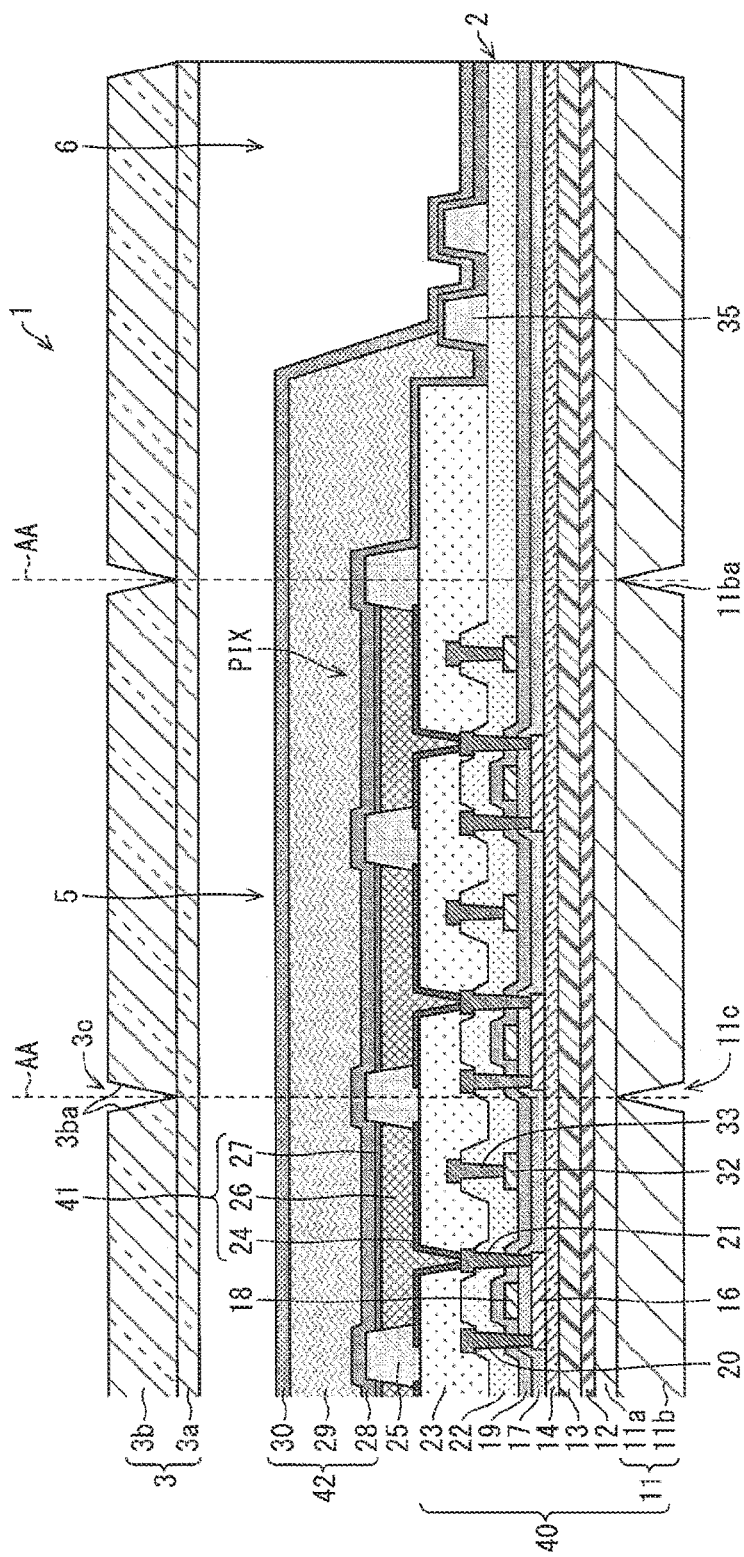
FIG. 1 is a cross-sectional view illustrating a configuration of an organic EL display device according to a first embodiment of the disclosure.

FIG. 1 is a cross-sectional view illustrating the configuration of the organic EL display device 1 according to the first embodiment of the disclosure. As illustrated in FIG. 1, the organic EL display device 1 includes an organic EL substrate 2, a second support member 3 applied to the organic EL substrate 2 with an adhesive layer 4 interposed between the second support member 3 and the organic EL substrate 2, a drive circuit not illustrated on the drawings, and the like. The organic EL display device 1 may include a touch panel applied to a surface of the second support member 3. In this embodiment, the organic EL display device 1 is a flexible image display device that is foldable The organic EL display device 1 includes a display region 5 in which pixels PIX are disposed in a matrix form to display an image, and a casing region 6 that is an adjacent region surrounding a periphery of the display region 5 and including no pixel PIX disposed. In this embodiment, the display region 5 has a square shape. Note that the display region 5 may have any shape other than a square shape.

The organic EL substrate 2 includes an organic EL element 41 and a sealing layer 42 provided on a Thin Film Transistor (TFT) substrate 40, in this order from the TFT substrate 40 side.

The organic EL substrate 2 includes a first support member 11 including a transparent insulating material such as a plastic film and a glass substrate. The first support member 11 has flexibility. An adhesive layer 12, a plastic film 13 including a resin such as polyimide (PI), a moisture prevention layer 14, and the like are provided on a whole surface of the first support member 11, in this order from the first support member 11 side.

The second support member 3 and the first support member 11 include a photocuring or thermosetting resin. The second support member 3 includes a plate-like portion 3a and a plurality of bulging portions 3b. The first support member 11 includes a plate-like portion 11a and a plurality of bulging portions 11b.

The plurality of bulging portions 3b is formed on an outside surface opposite to a contact surface with the adhesive layer 4 in the plate-like portion 3a. In other words, the second support member 3 includes the outside surface including grooves 3c that are recessed portions between the bulging portions 3b.

The plurality of bulging portions 11b is formed on an outside surface opposite to a contact surface with the adhesive layer 12 in the plate-like portion 11a. In other words, the first support member 11 includes the outside surface including grooves 11c that are recessed portions between the bulging portions 11b.

In this embodiment, a cross-sectional shape of each of the bulging portions 3b, 11b is a trapezoidal shape. Then, a cross-sectional shape of each of the grooves 3c, 11c is a V shape. Note that the cross-sectional shape of each of the bulging portions 3b, 11b is not limited to a trapezoidal shape, and various shapes can be adopted, such as a semicircular shape, a triangular shape, a square shape, or any polygonal shape other than a square shape.

Note that the second support member 3 and the first support member 11 may include a plurality of the bulging portions 3b, 11b, without the plate-like portions 3a, 11a. In this case, the adhesive layer 4 may be provided only in a formation region in which each of the bulging portions 3b is formed. Moreover, the adhesive layer 12 may be provided only in a formation region in which each of the bulging portions 11b is formed.

The plurality of bulging portions 3b, 11b of the second support member 3 and the first support member 11 can be formed by, for example, nanoimprinting or the like.

The bulging portions 3b each cover the pixels PIX from above. In this embodiment, side surfaces 3ba of the bulging portions 3b adjacent to each other are in contact with each other. The grooves 3c are located above the separation layer 25, and are not disposed above the pixels PIX.

The bulging portions 11b each cover the pixels PIX from below. In this embodiment, side surfaces 11ba of the bulging portions 11b adjacent to each other are in contact with each other. The grooves 11c are located below the separation layer 25, and are not disposed below the pixels PIX.

After formation of the plastic film 13 to the sealing layer 42 on the glass substrate, the glass substrate is peeled from the plastic film 13 by using laser light. Then, the first support member 11 is applied to the plastic film 13 from which the glass substrate has been peeled, with the adhesive layer 12 interposed between the first support member 11 and the plastic film 13, such that a surface on which the bulging portions 11b are formed is the outside surface that is more distant from an organic EL layer 26. As a result, the first support layer 11 is disposed opposite the sealing layer 42 side, as viewed from the organic EL layer 26.

At this time, the first support member 11 is applied to the plastic film 13 with relative positions of the first support member 11 and the plastic film 13 aligned such that the pixels PIX overlap with the bulging portions 11b. Therefore, an alignment mark for aligning is preferably formed on the plastic film 13 and the first support member 11.

Moreover, after formation of the sealing layer 42, the second support member 3 is applied to the sealing layer 42 with the adhesive layer 4 interposed between the second support member 3 and the sealing layer 42, such that a surface on which the bulging portions 3b are formed is the outside surface that is more distant from the organic EL layer 26.

At this time, the second support member 3 is applied to the sealing layer 42 with the adhesive layer 4 interposed between the second support member 3 and the sealing layer 42, and with relative positions of the second support member 3 and the plastic film 13 aligned such that the pixels PIX overlap with the bulging portions 3b. Therefore, an alignment mark for aligning is preferably formed on the second support member 3 and the plastic film 13 or the first support member 11.

Any of the second support member 3 and the first support member 11 may be applied first. The second and the first support members 3, 11 are aligned and applied with an intermediate member interposed between the second and the first support members 3, 11, such that the grooves 3c of the second support member 3 or the grooves 11c of the first support member 11, either of which is applied first, overlap with the grooves 11c of the first support member 11 or the grooves 3c of the second support member 3, either of which is applied second, as indicated by a broken line AA illustrated in FIG. 1.

A semiconductor layer 16 having an island shape, a gate insulating film 17 covering the semiconductor layer 16 and the moisture prevention layer 14, a gate electrode 18 provided on the gate insulating film 17 to overlap with the semiconductor layer 16, a first interlayer film 19 covering the gate electrode 18 and the gate insulating film 17, a second interlayer film 22 covering the first interlayer film 19, and an interlayer insulating film (first interlayer insulating film) 23 covering the second interlayer film 22 are provided on the moisture prevention layer 14.

Moreover, a source electrode 20 and a drain electrode 21 are connected with the semiconductor layer 16 via contact holes provided in the gate insulating film 17, the first interlayer film 19 and the second interlayer film 22.

The first interlayer film 19 and the second interlayer film 22 are inorganic insulating films including silicon nitride, silicon oxide or the like. The second interlayer film 22 covers wiring 32. The interlayer insulating film 23 is an organic insulating film including a photosensitive resin such as acrylic and polyimide. The interlayer insulating film 23 covers a TFT element and wiring 33, and levels steps on the TFT element and on the wiring 33. Thus, the interlayer insulating film 23 levels an area within the display region 5.

In this embodiment, the interlayer insulating film 23 is provided in the display region 5, and is not provided in the casing region 6. Note that the interlayer insulating film 23 may be provided not only in the display region 5, but also in the casing region 6.

The TFT element includes the semiconductor layer 16, the gate electrode 18, the source electrode 20 and the drain electrode 21, and the semiconductor layer 16, the gate electrode 18, the source electrode 20 and the drain electrode 21 are disposed in each pixel PIX. The TFT element is a transistor for pixel drive. Moreover, the wiring 32 and the wiring 33 are connected with each other via contact holes provided in the second interlayer film 22.

Moreover, although not illustrated on the drawings, gate wiring connected to the gate electrode 18 and source wiring connected to the source electrode 20 are provided on the organic EL substrate 2. The gate wiring and the source wiring intersect orthogonally as viewed in a direction orthogonal to a substrate plane of the organic EL substrate 2.

The organic EL element 41 includes a lower electrode 24, the organic EL layer 26 and an upper electrode 27. The organic EL element 41 is a light emitting element capable of emitting light at high luminance with a low voltage direct current driving. The lower electrode 24, the organic EL layer 26 and the upper electrode 27 are layered in this order from the TFT substrate 40 side. Note that in this embodiment, a layer between the lower electrode 24 and the upper electrode 27 is collectively referred to as the organic EL layer 26. The organic EL layer 26 is disposed in each pixel PIX.

Moreover, an optical adjustment layer configured to carry out optical adjustment, and an electrode protection layer configured to protect the electrode may be formed on the upper electrode 27. In this embodiment, the organic EL layer 26 formed in each pixel, the electrode layers (lower electrode 24 and upper electrode 27), and the optical adjustment layer and the electrode protection layer not illustrated on the drawings but formed as necessary are collectively referred to as the organic EL element 41.

The lower electrode 24 is formed on the interlayer insulating film 23. The lower electrode 24 injects (supplies) holes into the organic EL layer 26, and the upper electrode 27 injects electrons into the organic EL layer 26. The lower electrode 24 and the upper electrode 27 form a pair of electrodes.

The holes and electrons injected into the organic EL layer 26 form excitons by recombination in the organic EL layer 26. When the formed excitons are deactivated from an excited state to a ground state, the excitons emit light and the emitted light is emitted out of the organic EL element 41.

The lower electrode 24 is electrically connected with the drain electrode 21 of the TFT element via a contact hole formed in the interlayer insulating film 23.

The lower electrode 24 is patterned and formed in an island shape for each pixel PIX, and end portions of the lower electrode 24 are covered with a separation layer 25. The separation layer 25 is formed on the interlayer insulating film 23 to cover the end portions of the lower electrode 24. The separation layer 25 is an organic insulating film including a photosensitive resin such as acrylic and polyimide.

Figure 2:
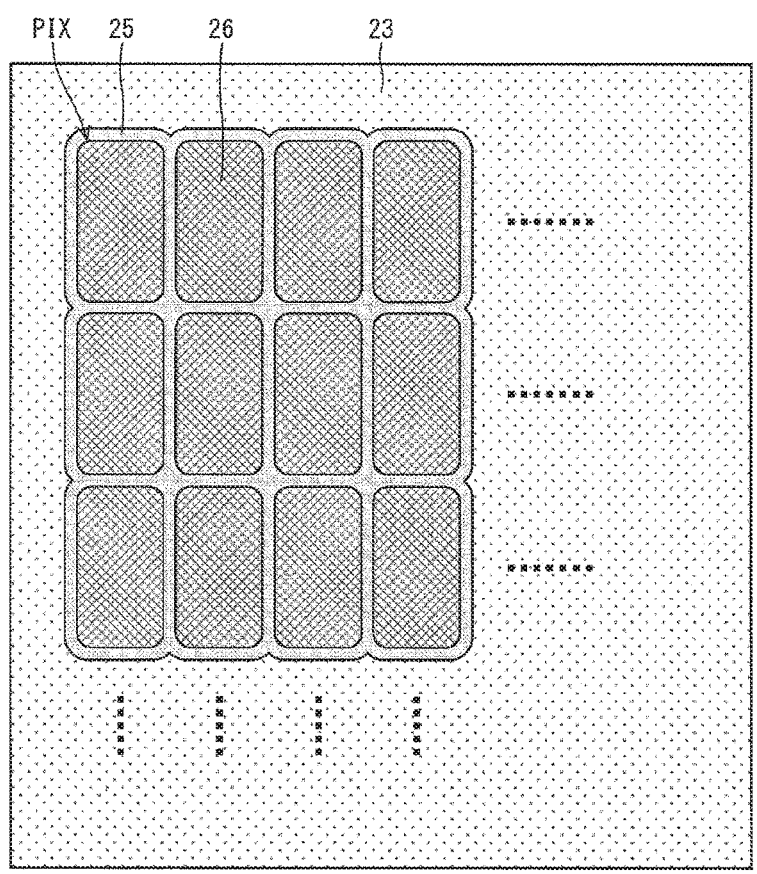
FIG. 2 illustrates planar shapes of a separation layer and an organic EL layer of the organic EL display device according to the first embodiment of the disclosure.

FIG. 2 illustrates planar shapes of the separation layer 25 and the organic EL layer 26. As illustrated in FIGS. 1 and 2, the separation layer 25 covers edges of the lower electrode 24 and a space between lower electrodes 24.

The separation layer 25 is formed between the pixels PIX adjacent to each other. The separation layer 25 is an edge cover configured to prevent short circuit with the upper electrode 27 at the end portions of the lower electrode 24 due to concentration of the electrodes or thinning of the organic EL layer 26. Moreover, concentration of electric fields at the end portions of the lower electrode 24 is prevented by providing the separation layer 25. As a result, degradation of the organic EL layer 26 is prevented.

The organic EL layer 26 is provided in a region surrounded by the separation layer 25. In other words, the separation layer 25 surrounds edges of the organic EL layer 26, and side walls of the separation layer 25 are in contact with side walls of the organic EL layer 26. In a case where the organic EL layer 26 is formed by the ink-jet method, the separation layer 25 functions as a bank to confine a liquid material serving as the organic EL layer 26.

In this embodiment, the region surrounded by the separation layer 25 is referred to as the pixel PIX. The separation layer 25 extends between the pixels PIX in a row direction and in a column direction normal to the row direction.

The organic EL layer 26 is provided in the region surrounded by the separation layer 25 in the pixel PIX. The organic EL layer 26 can be formed by vapor deposition, the ink-jet method and the like.

The organic EL layer 26 includes, for example, a hole injecting layer, a hole transport layer, a light emitting layer, an electron transport layer and an electron injecting layer layered in this order from the lower electrode 24 side. Note that a single layer may have a plurality of functions. For example, instead of the hole injecting layer and the hole transport layer, a hole injection-cum-transport layer having the functions of both of the hole injecting layer and the hole transport layer may be provided. Moreover, instead of the electron injecting layer and the electron transport layer, an electron injection-cum-transport layer having the functions of both of the electron injecting layer and the electron transport layer may be provided. Moreover, a carrier blocking layer may be provided between the layers as appropriate.

As illustrated in FIG. 1, the upper electrode 27 is patterned and formed in an island shape for each pixel PIX. The upper electrodes 27 formed in the pixels PIX are connected to each other by, for example, auxiliary wiring not illustrated on the drawings. Note that the upper electrode 27 may not be formed in an island shape for each pixel, and may be formed on the whole surface of the display region 5.

Note that in this embodiment, the lower electrode 24 is described as a positive electrode (pattern electrode, pixel electrode), and the upper electrode 27 is described as a negative electrode (common electrode), but the lower electrode 24 may be a negative electrode, and the upper electrode 27 may be a positive electrode. However, in this case, the order of the layers constituting the organic EL layer 26 is reversed.

Moreover, in a case where the organic EL display device 1 is of a bottom-emitting type configured to emit light from a rear surface side of the first support member 11, the upper electrode 27 is formed as a reflective electrode including a reflective electrode material, and the lower electrode 24 is formed as a transparent electrode or a semi-transparent electrode including a transparent or semi-transparent transparent electrode material.

On the other hand, in a case where the organic EL display device 1 is of a top-emitting type configured to emit light from the second support member 3 side, the electrode structure is the opposite to the case of the bottom-emitting type. In other words, in a case where the organic EL display device 1 is of a top-emitting type, the lower electrode 24 is formed as a reflective electrode, and the upper electrode 27 is formed as a transparent electrode or a semi-transparent electrode.

A frame-shaped bank 35 surrounding the display region 5 in a frame shape is provided on the second interlayer film 22 in the casing region 6.

When a liquid organic insulating material serving as the organic layer (resin layer) 29 of the sealing layer 42 is applied to the whole surface of the display region 5, the frame-shaped bank 35 restricts wetting and spreading of the liquid organic insulating material to prevent the liquid organic insulating material from overflowing outside the frame-shaped bank 35. The organic layer 29 is formed by hardening the organic insulating material. In other words, the frame-shaped bank 35 is a bank configured to support the organic layer 29 from the side via an inorganic layer 28.

The frame-shaped bank 35 surrounds a periphery of the display region 5 in a linear manner. The frame-shaped bank 35 has a shape conforming to a shape of the display region 5. In other words, the frame-shaped bank 35 has a square shape corresponding to the display region 5 having a square shape.

In this embodiment, since the frame-shaped bank 35 surrounds the display region 5 twice, an effect of restricting wetting and spreading of the organic material applied increases, as compared with the case where the frame-shaped bank 35 surrounds the display region 5 only once. Therefore, when the organic material is applied, it is possible to more reliably prevent the organic material from overflowing outside of the frame-shaped bank 35, as compared with the case where the frame-shaped bank 35 surrounds the display region 5 once. Note that the frame-shaped bank 35 may surround the display region 5 once, or may surround the display region 5 three or more times.

The frame-shaped bank 35 is an organic insulating film including a photosensitive resin such as acrylic and polyimide. The same material as the material used for the separation layer 25 can be used for the frame-shaped bank 35.

Further, the frame-shaped bank 35 may be patterned and formed by photolithography or the like at the same step as that for the separation layer 25.

Note that the frame-shaped bank 35 may be patterned and formed with a different material from the material for the separation layer, and at a different step from that for the separation layer 25.

Moreover, the frame-shaped bank 35 and the separation layer 25 preferably each have a forward taper shape to achieve favorable coverage of a formation surface on which each of the frame-shaped bank 35 and the separation layer 25 is formed.

The sealing layer 42 includes an inorganic layer 28, an organic layer 29 and an inorganic layer 30 layered in this order from the TFT substrate 40 side. The sealing layer 42 covers the organic EL element 41, the separation layer 25, the interlayer insulating film 23, the second interlayer film 22 and the frame-shaped bank 35. Note that as described above, an organic layer (resin layer) or an inorganic layer not illustrated in the drawings, such as an optical adjustment layer and an electrode protective layer may be formed between the upper electrode 27 and the sealing layer 42.

The sealing layer 42 prevents degradation of the organic EL element 41 due to ingress of external moisture or oxygen by, for example, Thin Film Encapsulation (TFE) of the organic EL layer 26.

The inorganic layers 28, 30 each have a moisture prevention function of preventing ingress of moisture, and prevent degradation of the organic EL element 41 due to moisture or oxygen.

The organic layer 29 relieves stresses in the inorganic layers 28, 30 having large film stresses; levels a surface of the organic EL element 41 by burying step portions or foreign matter on the surface of the organic EL element 41; fills pinholes; or suppresses occurrence of cracks or film peeling during layering of the inorganic layers. As an example, the organic layer 29 can be formed by using the ink-jet method.

Note that the above layered structure is one example, and the sealing layer 42 is not limited to the three-layer structure as described above (inorganic layer 28/organic layer 29/inorganic layer 30). The sealing layer 42 may include four or more of inorganic layers and organic layers layered.

An example of the material for the organic layer includes an organic insulating material (resin material) such as an acrylic resin and an epoxy resin.

Moreover, an example of the material for the inorganic layer includes an inorganic insulating material such as silicon nitride, silicon oxide, silicon oxynitride and $Al_2O_3$.

Second Support Member 3 and First Support Member 11

Figure 3A:
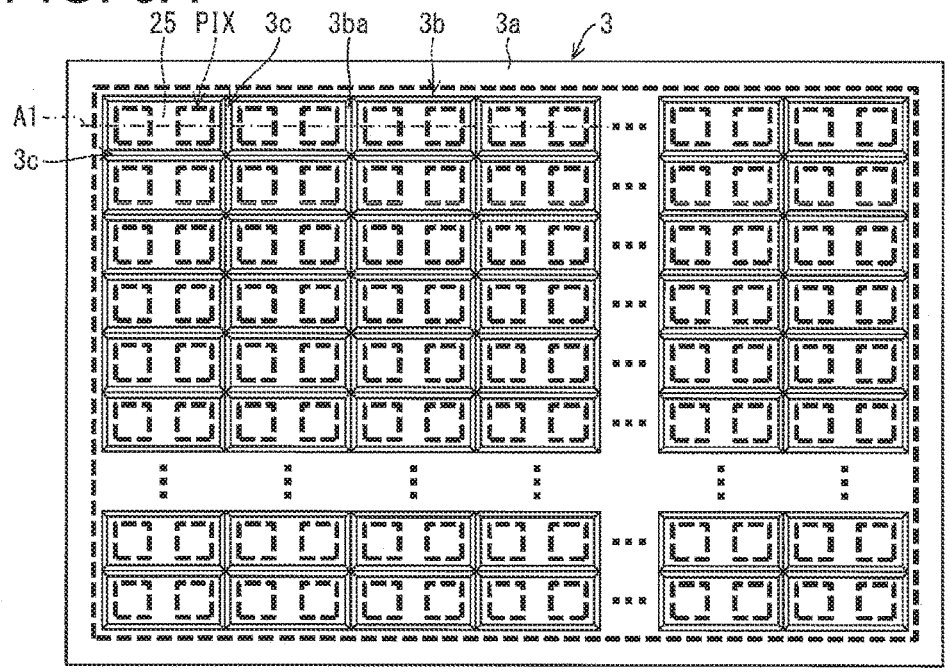
FIG. 3A is a plan view illustrating a configuration of a transparent film of the organic EL display device.
Figure 3B:
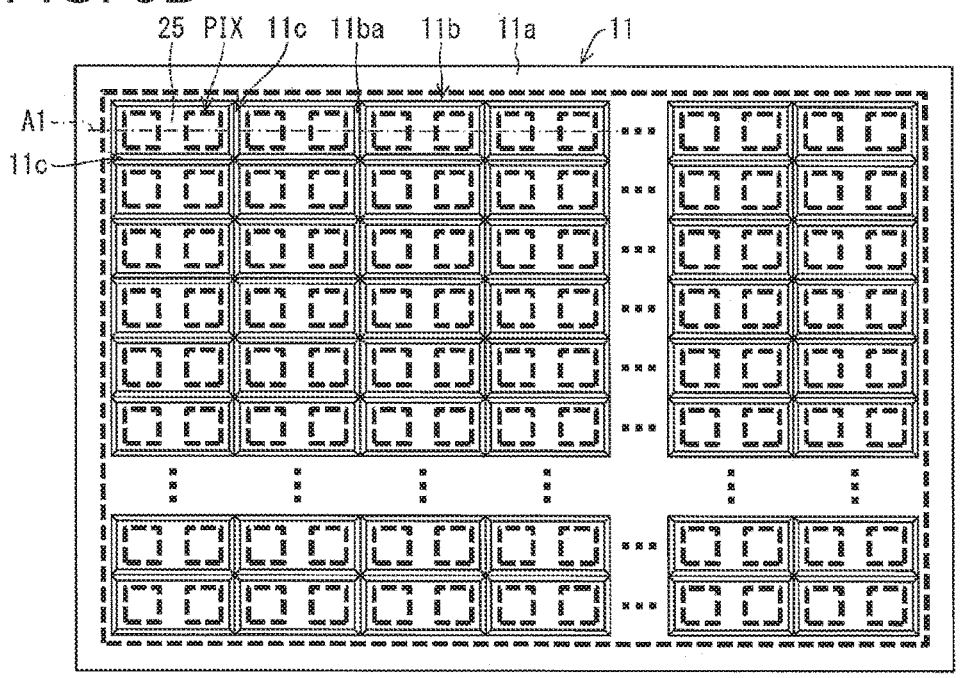
FIG. 3B is a plan view illustrating a configuration of a support member of the organic EL display device.

FIG. 3A is a plan view illustrating a configuration of the second support member 3, and FIG. 3B is a plan view illustrating a configuration of the first support member 11.

Figure 4A:
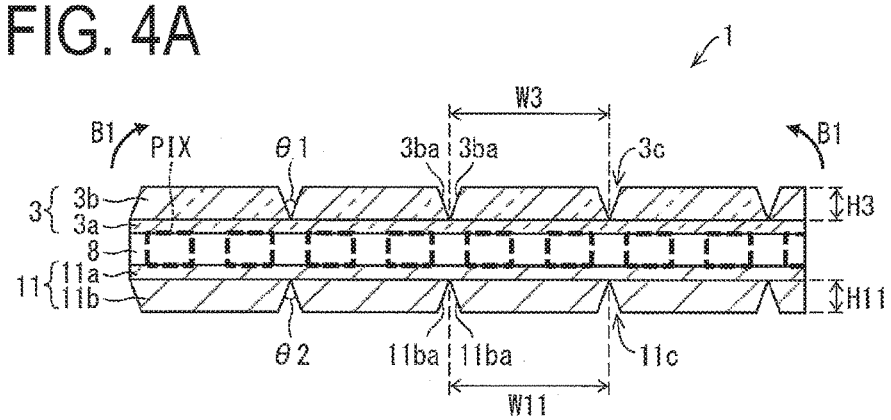
FIG. 4A is a cross-sectional view of the organic EL display device at a line A1 illustrated in each of FIGS. 3A and 3B.
Figure 4B:
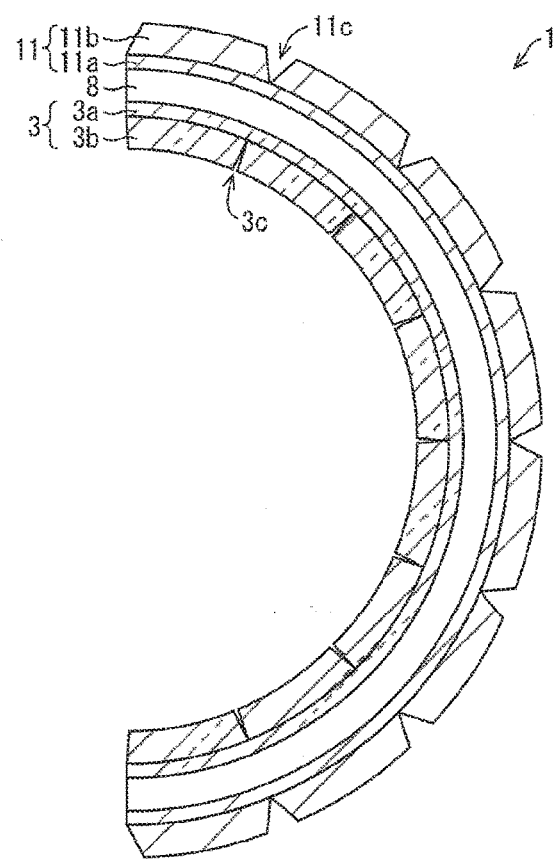
FIG. 4B illustrates the organic EL display device curved.

FIG. 4A is a cross-sectional view of the organic EL display device at a line A1 illustrated in each of FIGS. 3A and 3B, and FIG. 4B illustrates the organic EL display device curved.

Note that hereinafter, a member including the pixel PIX on which the organic EL layer 26 is formed and being disposed between the second support member 3 and the first support member 11 is referred to as an intermediate member 8.

As illustrated in FIGS. 3A and 3B and FIG. 4A, the bulging portions 3b of the second support member 3 are formed in a matrix form on the outside surface opposite to the contact surface with the intermediate member 8 in the second support member 3. Therefore, the grooves 3c between the bulging portions 3b are formed in a lattice form on the outside surface of the second support member 3.

Moreover, the bulging portions 11b of the first support member 11 are formed in a matrix form on the outside surface opposite to the contact surface with the intermediate member 8 in the first support member 11. Therefore, the grooves 11c between the bulging portions 11b are formed in a lattice form on the outside surface of the first support member 11.

Thus, the grooves 3c, 11c are formed on the outside surfaces of both the second and the first support members 3, 11 sandwiching the pixel PIX.

As illustrated in FIGS. 4A and 4B, for example, when the organic EL display device 1 is curved in a direction indicated by an arrow B1 such that the second support member 3 is on the inside, a distance between the side surfaces 3ba of the grooves 3c on the inside reduces, and a distance between the side surfaces 11ba of the grooves 11c on the outside increases. Thus, in the organic EL display device 1, the grooves 11c, 3c are formed on both the outside surface of the first support member 11 and the outside surface of the second support member 3 sandwiching the intermediate member 8, and therefore, flexibility (ease of curving) can be enhanced, as compared with a configuration in which the grooves are not formed on the respective outside surfaces.

Moreover, when the side surfaces 3ba of the bulging portions 3b are brought into contact with one another by curving and then the organic EL display device is further curved, reaction force increases as compared with when the side surfaces 3ba are not in contact with one another. As a result, an effect of suppressing excessive curving can also be obtained.

Then, since the plurality of bulging portions 11b is formed on the first support member 11 and the plurality of bulging portions 3b is formed on the second support member 3, sufficient shock resistance can be secured.

Thus, both enhancement of flexibility and suppression of reduction in shock resistance are achieved in the organic EL display device 1.

Moreover, as illustrated in FIGS. 3A and 3B and FIG. 4A, in the organic EL display device 1, the grooves 3c, 11c of the second support member 3 and the first support member 11 overlap with one another with the intermediate member 8 interposed between the second support member 3 and the first support member 11. Therefore, the thicknesses at portions in which the grooves 3c and the grooves 11c overlap with one another are reduced, and flexibility can be enhanced as compared with the case where the grooves do not overlap with one another.

In other words, positions of the grooves 3c, 11c on planes orthogonal to the film plane of the intermediate member 8 match one another. Therefore, a neutral plane formed in the intermediate member 8 (at or near the moisture prevention layer 14, the sealing layer 42, or the organic EL layer 26) does not move at portions of the grooves 3c, 11c, and curving strain in the intermediate member 8 (the moisture prevention layer 14, the sealing layer 42 or the organic EL layer 26) does not increase during curving.

Therefore, occurrence of cracking or film separation in the intermediate member 8 (the moisture prevention layer 14, the sealing layer 42 or the organic EL layer 26) can be suppressed.

As illustrated in the FIG. 4A, a distance (width of each of the bulging portions 11b) W11 between the grooves 11c adjacent to each other and a distance (width of each of the bulging portions 3b) W3 between the grooves 3c adjacent to each other are equal. In other words, the distance W11 is an integer multiple of the distance W3. In this embodiment, the distance W11 is equal to the distance W3, and the integer multiple is one.

Therefore, the organic EL display device 1 is easy to curve in any of the case where the organic EL display device 1 is curved with the second support member 3 on the inside and the case where the organic EL display device 1 is curved with the first support member 11 on the inside. Thus, the organic EL display device 1 having favorable ease-of-use and high convenience can be obtained.

On the other hand, the thicknesses at portions in which the bulging portions 3b of the second support member 3 and the bulging portions 11b of the first support member 11 overlap with one another are increased. Therefore, sufficient shock resistance and abrasion resistance can be secured.

A height H3 of each of the bulging portions 3b (distance from a bottom surface to a crown surface of each of the bulging portions 3b) may be the height that can prevent excessive curving of the organic EL display device 1 while enabling efficient curving of the organic EL display device 1 and that can secure shock resistance and abrasion resistance. As an example, the height H3 of each of the bulging portions 3b is approximately in the range of 30 µm or greater and 100 µm or less.

A height H11 of each of the bulging portions 11b (distance from a bottom surface to a crown surface of each of the bulging portions 11b) may be the height that can prevent excessive curving of the organic EL display device 1 while enabling efficient curving of the organic EL display device 1 and that can secure shock resistance and abrasion resistance. As an example, the height H11 of each of the bulging portions 11b is approximately in the range of 30 µm or greater and 100 µm or less.

Moreover, the height H3 of each of the bulging portions 3b is preferably equal to the height H11 of each of the bulging portions 11b. As a result, even when the organic EL display device 1 is curved with any of the second and the first support members 3, 11 on the inside, it is possible to prevent excessive curving of the organic EL display device 1 while enabling efficient curving of the organic EL display device 1, and it is possible to secure shock resistance and abrasion resistance.

Then, as illustrated in FIGS. 3A and 3B and FIG. 4A, the bulging portions 3b of the second support member 3 cover a plurality of the pixels PIX from above. As an example, in this embodiment, each of the bulging portions 3b of the second support member 3 covers two pixels PIX from above. Then, the grooves 3c are disposed above an area between the pixels PIX (separation layer 25 (see FIG. 1)), and are not disposed above the pixels PIX.

Moreover, the bulging portions 11b of the first support member 11 cover the plurality of pixels PIX from below. As an example, each of the bulging portions 11b of the first support member 11 covers two pixels PIX from below. Then, the grooves 11c are disposed below an area between the pixels PIX (separation layer 25 (see FIG. 1)), and are not disposed below the pixels PIX.

In other words, a distance between the grooves 11c, 3c formed on one of the first support member 11 and the second support member 3 that is located on the image display surface side is an integral multiple of a pitch of the pixels PIX.

As a result, it is possible to prevent light emitted from the organic EL layer 26 (see FIG. 1) from being diffused by the grooves 3c or the grooves 11c. Therefore, reduction in quality of a displayed image due to the grooves 3c or the grooves 11c can be prevented. In addition, both enhancement of flexibility and suppression of reduction in shock resistance can be achieved.

Note that among the grooves 3c formed on the second support member 3 and the grooves 11c formed on the first support member 11, at least the grooves formed on the member located on the image display surface side may overlap with an area between the pixels PIX (in other words, the separation layer 25), and may not overlap with the pixels PIX.

In a case where the organic EL display device 1 is of a top-emitting type configured to emit light from the second support member 3 side, one of the first support member 11 and the second support member 3 that is located on the image display surface side is the second support member 3. On the other hand, in a case where the organic EL display device 1 is of a bottom-emitting type configured to emit light from the first support member 11 side, the one of the first support member 11 and the second support member 3 that is located on the image display surface side is the first support member 11.

Here, a plurality of layers such as the TFT element, the lower electrode 24, the organic EL layer 26 and the upper electrode 27 is layered within the pixel PIX, as described with reference to FIG. 1. Therefore, when the pixel PIX is curved, a greater load is applied to each layer as compared with the case where regions other than the pixel PIX are curved, and a fault may occur in an electrode or the like.

Therefore, as illustrated in FIGS. 3A and 3B and FIGS. 4A and 4B, in the organic EL display device 1, the bulging portions 11b of the first support member 11 and the bulging portions 3b of the second support member 3 both overlap with the plurality of pixels PIX.

In other words, both the grooves 11c and the grooves 3c, which are easy to curve, are provided between the pixels PIX, and do not overlap with the pixels PIX.

As a result, the pixels PIX are difficult to curve due to the bulging portions 11b and the bulging portions 3b, as compared with the case where the grooves 11c and the grooves 3c are disposed above and below the pixels PIX. As a result, occurrence of faults in electrodes or the like disposed within the pixels PIX due to curving can be suppressed. Therefore, the organic EL display device 1 having flexibility and high durability can be obtained.

As an example, in this embodiment, each of the bulging portions 3b of the second support member 3 covers two pixels PIX from above. Moreover, each of the bulging portions 11b of the first support member 11 covers two pixels PIX from below. However, each of the number of the pixels PIX covered by each of the bulging portions 3b from above and the number of the pixels PIX covered by each of the bulging portions 11b from below is not limited to two, and may be one, or three or more.

Moreover, as illustrated in FIGS. 3A and 3B, the grooves 11c, 3c extend in the row and column directions. As a result, the organic EL display device 1 easy to curve in the row and column directions can be obtained.

An angle θ1 is formed between the side surfaces 3ba in each of the grooves 3c. An angle θ2 is formed between the side surfaces 11ba in each of the grooves 11c. The angle θ1 and the angle θ2 may be designed variously in accordance with a radius of curvature of the organic EL display device 1.

Second Embodiment

A second embodiment of the disclosure will be described below with reference to FIGS. 5A and 5B and FIG. 6. Note that for convenience of explanation, members having the same functions as the members described in the first embodiment are given the same reference signs, and the description of the members is omitted.

Figure 5A:
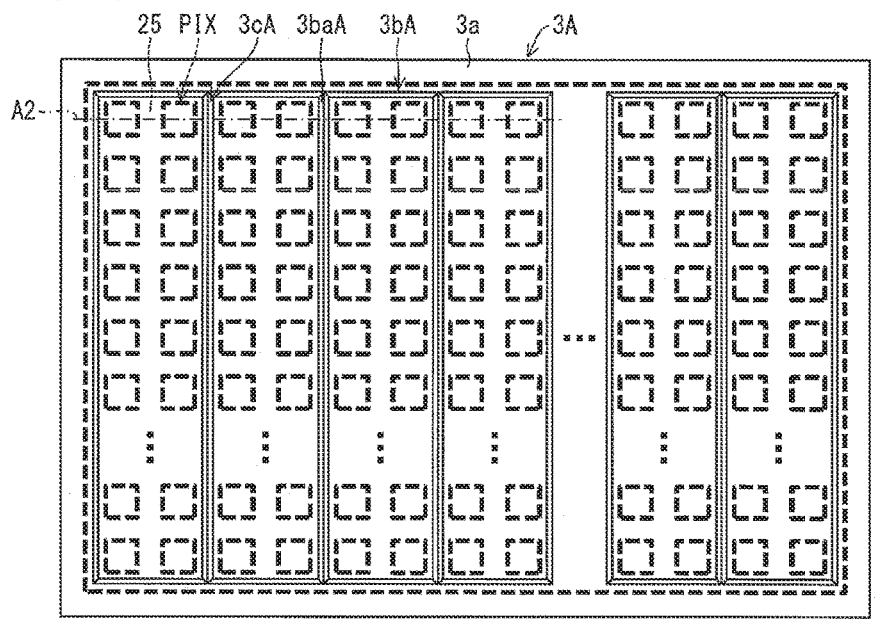
FIG. 5A is a plan view illustrating a configuration of a sealing layer of an organic EL display device according to a second embodiment of the disclosure.
Figure 5B:
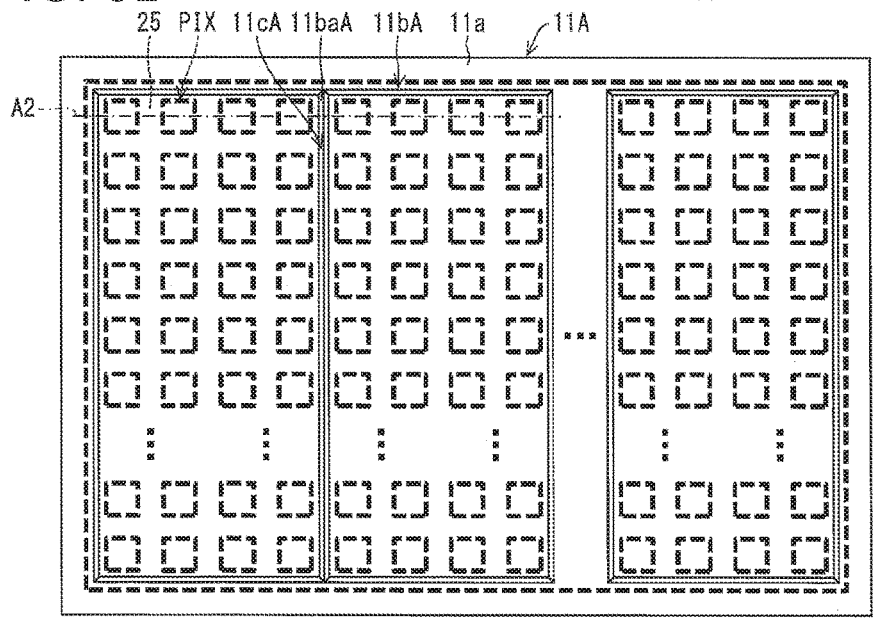
FIG. 5B is a plan view illustrating a configuration of a support member of the organic EL display device according to the second embodiment of the disclosure.

FIG. 5A is a plan view illustrating a configuration of a second support member 3A of an organic EL display device according to the second embodiment of the disclosure, and FIG. 5B is a plan view illustrating a configuration of a first support member 11A of the organic EL display device according to the second embodiment of the disclosure.

Figure 6:
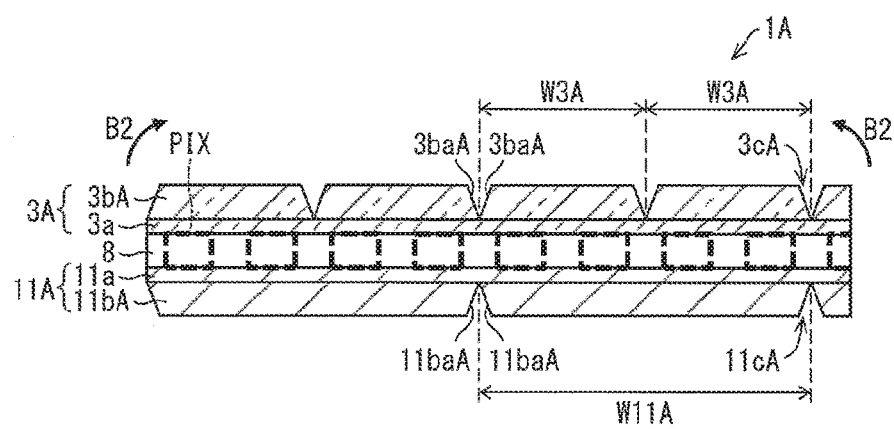
FIG. 6 is a cross-sectional view of the organic EL display device at a line A2 illustrated in each of FIGS. 5A and 5B.

FIG. 6 is a cross-sectional view of the organic EL display device at a line A2 illustrated in each of FIGS. 5A and 5B.

The organic EL display device 1 (see FIG. 1 and the like) may include the second support member 3A and the first support member 11A illustrated in FIGS. 5A and 5B and FIG. 6, instead of the second support member 3 and the first support member 11.

The second support member 3A includes a plate-like portion 3a and a plurality of bulging portions 3bA. Of pixels PIX arranged in row and column directions, the number of the pixels PIX arranged in the column direction (the vertical direction in the plane of the paper in FIG. 5A) and covered by each of the bulging portions 3bA is different from the number of the pixels PIX covered by each of the bulging portions 3b (see FIG. 3A). The rest of the configuration of each of the bulging portions 3bA is the same as the configuration of each of the bulging portions 3b.

The first support member 11A includes a plate-like portion 11a and a plurality of bulging portions 11bA. The number of the pixels PIX arranged in the row and column directions (the vertical and lateral directions in the plane of the paper in FIG. 5B) and covered by each of the bulging portions 11bA is different from the number of the pixels PIX covered by each of the bulging portions 11b (see FIG. 3A). The rest of the configuration of each of the bulging portions 11bA is the same as the configuration of each of the bulging portions 11b.

As illustrated in FIG. 5A, each of the bulging portions 3bA extends such that the column direction corresponds to a longitudinal direction. Each of the bulging portions 3bA covers all of the pixels PIX arranged in the column direction. Each of the bulging portions 3bA covers two pixels PIX arranged in the row direction orthogonal to the column direction.

Grooves 3cA between the bulging portions 3bA adjacent to each other extend in the column direction. No groove extending in the row direction (lateral direction in the plane of the paper) orthogonal to the column direction is formed on the second support member 3A.

As illustrated in FIG. 5B, each of the bulging portions 11bA extends such that the column direction corresponds to a longitudinal direction. Each of the bulging portions 11bA covers all of the pixels PIX arranged in the column direction. Each of the bulging portions 11bA covers four pixels PIX arranged in the row direction orthogonal to the column direction.

Grooves 11cA between the bulging portions 11bA adjacent to each other extend in the column direction. No groove extending in the row direction orthogonal to the column direction is formed on the first support member 11A.

As illustrated in FIG. 6, in an organic EL display device 1A including the first support member 11A and a sealing layer 42A, the grooves 11cA of the first support member 11A overlap with the grooves 3cA of the second support member 3A with an intermediate member 8 interposed between the first support member 11A and the second support member 3A. Therefore, the thicknesses at portions in which the grooves 3cA and the grooves 11cA overlap with one another are reduced, and flexibility can be enhanced as compared with the case where the grooves do not overlap with one another.

A distance (width of each of the bulging portions 11bA) W11A between the grooves 3cA adjacent to each other is an integer multiple of a distance (width of each of the bulging portions 3bA) W3A between the grooves 3cA adjacent to each other. In this embodiment, the distance W11A is double the distance W3A. In other words, the number of the grooves 3cA formed in the second support member 3A is double the number of the grooves 11cA provided in the first support member 11A.

Therefore, in a case where the organic EL display device 1A is curved with the second support member 3A on the inside as indicated by an arrow B2, a radius of curvature of the organic EL display device 1A reduces and the organic EL display device 1A is easy to curve, as compared with a case where the organic EL display device 1A is curved with the first support member 11A on the inside. As a result, the organic EL display device 1A suitable for applications in which the organic EL display device 1A is often curved with the second support member 3A on the inside can be obtained. Note that the distance W11A may be greater than the distance W3A by an integer multiple, and the integer multiple is not limited to two.

On the other hand, the thicknesses at portions in which the bulging portions 3bA of the second support member 3A and the bulging portions 11bA of the first support member 11A overlap with one another are increased. Therefore, sufficient shock resistance and abrasion resistance can be secured.

Moreover, as illustrated in FIGS. 5A and 5B, the grooves 11c, 3c extend only in one of the row and column directions, that is, in the column direction, and do not extend in the row direction. As a result, the organic EL display device 1A easy to curve in the row direction and having higher stiffness in the column direction than in the row direction can be obtained.

Note that in the organic EL display device 1A, the grooves 11c, 3c may extend not only in the column direction, but also in the row direction.

Third Embodiment

A third embodiment of the disclosure will be described below with reference to FIGS. 7A and 7B and FIG. 8. Note that for convenience of explanation, members having the same functions as the members described in the first and second embodiments are given the same reference signs, and the description of the members is omitted.

Figure 7A:
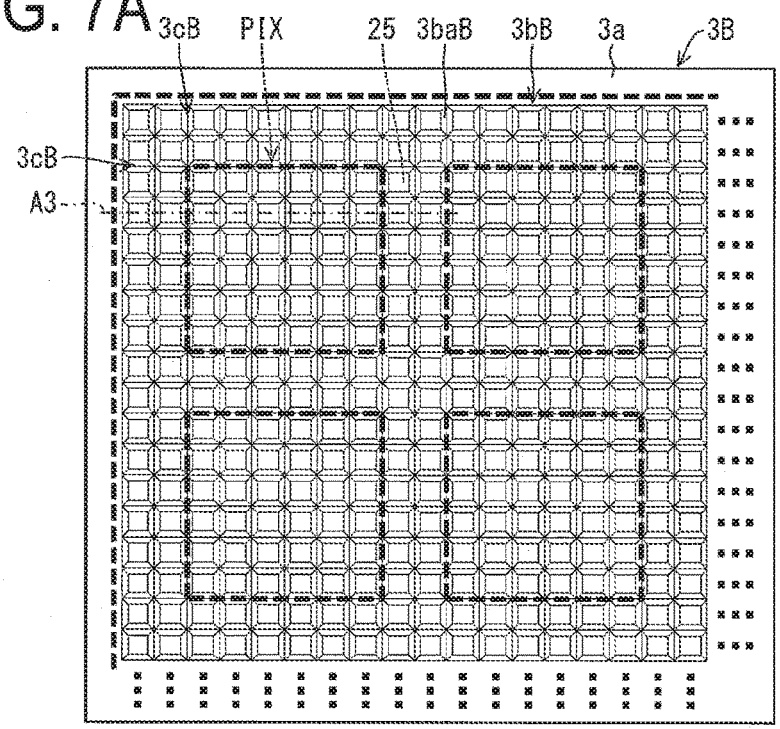
FIG. 7A is a plan view illustrating a configuration of a sealing layer of an organic EL display device according to a third embodiment of the disclosure.
Figure 7B:
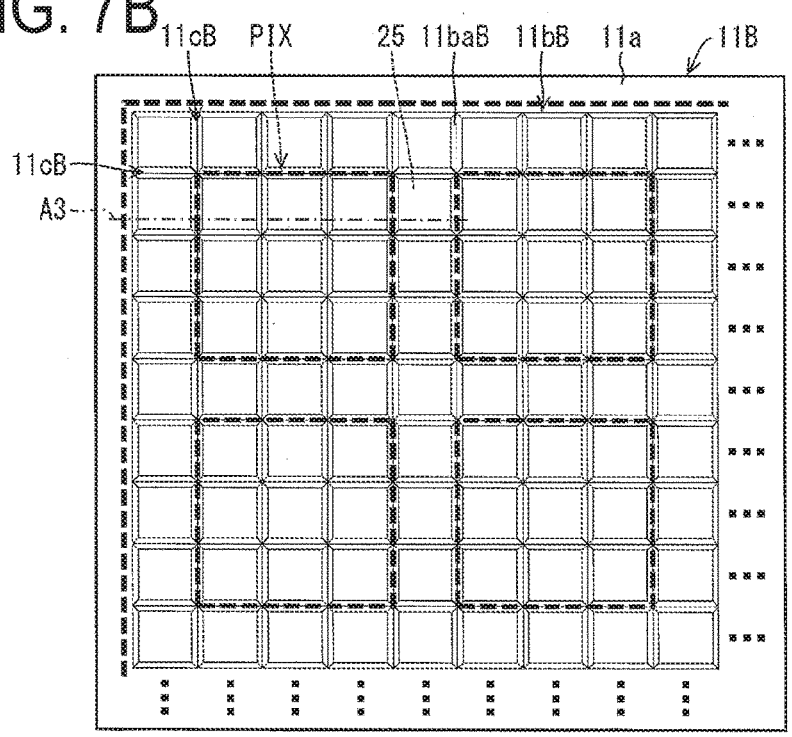
FIG. 7B is a plan view illustrating a configuration of a support member of the organic EL display device according to the third embodiment of the disclosure.

FIG. 7A is a plan view illustrating a configuration of a second support member 3B of an organic EL display device according to the third embodiment of the disclosure, and FIG. 7B is a plan view illustrating a configuration of a first support member 11B of the organic EL display device according to the third embodiment of the disclosure.

Figure 8:
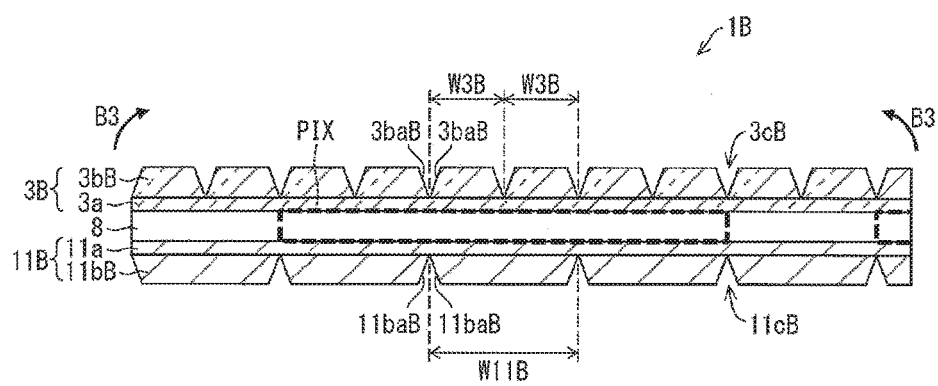
FIG. 8 is a cross-sectional view of the organic EL display device at a line A3 illustrated in each of FIGS. 7A and 7B.

FIG. 8 is a cross-sectional view of the organic EL display device at a line A3 illustrated in each of FIGS. 7A and 7B.

The organic EL display device 1 (see FIG. 1 and the like) may include a second support member 3B and a first support member 11B illustrated in FIGS. 7A and 7B and FIG. 8, instead of the second support member 3 and the first support member 11.

The second support member 3B includes a plate-like portion 3a and a plurality of bulging portions 3bB. Each of the bulging portions 3bB differs from each of the bulging portions 3b (see FIG. 3A) in that the bulging portions 3bB are smaller than the pixels PIX. The rest of the configuration of each of the bulging portions 3bB is the same as the configuration of each of the bulging portions 3b.

The first support member 11B includes a plate-like portion 11a and a plurality of bulging portions 11bB. Each of the bulging portions 11bB differs from each of the bulging portions 11b (see FIG. 3B) in that the bulging portions 11bB are smaller than the pixels PIX. The rest of the configuration of each of the bulging portions 11bA is the same as the configuration of each of the bulging portions 11b.

As illustrated in FIG. 7A, the area of each of the bulging portions 3bB is smaller than the area of each of the pixels PIX, and the bulging portions 3bB are arranged in a matrix form and disposed within each of the pixels PIX and between the pixels PIX.

Grooves 3cB between the bulging portions 3bB extend in a lattice form in the column direction and the row direction.

As illustrated in FIG. 7B, the area of each of the bulging portions 11bB is smaller than the area of each of the pixels PIX, and the bulging portions 11bB are arranged in a matrix form and disposed within each of the pixels PIX and between the pixels PIX.

Grooves 11cB between the bulging portions 11bB extend in a lattice form in the column direction and the row direction.

As illustrated in FIG. 8, in an organic EL display device 1B including a second and a first support members 3B, 11B, the grooves 11cB of the first support member 11B overlap with the grooves 3cB of the second support member 3B with an intermediate member 8 interposed between the first support member 11B and the second support member 3B. Therefore, the thicknesses at portions in which the grooves 3cB and the grooves 11cB overlap with one another are reduced, and flexibility can be enhanced as compared with the case where the grooves do not overlap with one another.

A distance (width of each of the bulging portions 11bB) W11B between the grooves 11cB adjacent to each other is an integer multiple of a distance (width of each of the bulging portions 3bB) W3B between the grooves 3cB adjacent to each other. In this embodiment, the distance W11B is double the distance W3B.

In other words, the number of the grooves 3cB formed in the second support member 3B in a cross-section in the row direction of the organic EL display device 1B (the cross-section illustrated in FIG. 8) is double the number of the grooves 11cB provided in the first support member 11B.

Moreover, in the organic EL display device 1B, a distance (width of each of the bulging portions 11bB) between the grooves 11cB adjacent to each other is also double a distance (width of each of the bulging portions 3bB) between the grooves 3cB adjacent to each other in a cross-section in the column direction (the direction orthogonal to the line A3 in FIGS. 7A and 7B).

Therefore, in a case where the organic EL display device 1B is curved with the second support member 3B on the inside as indicated by an arrow B3 in FIG. 8, a radius of curvature of the organic EL display device 1B curved reduces, and the organic EL display device 1B is easy to curve, as compared with a case where the organic EL display device 1B is curved with the first support member 11B on the inside. As a result, the organic EL display device 1B suitable for applications in which the organic EL display device 1B is often curved with the second support member 3A on the inside can be obtained.

Moreover, the pixel pitch is an integral multiple of the grooves 3cB and the grooves 11cB.

In this embodiment, the pixel pitch is eight times the pitch of the bulging portions 3bB. In other words, the pixel pitch is eight times the distance W3B. Moreover, the pixel pitch is four times the pitch of the bulging portions 11bB. In other words, the pixel pitch is four times the distance W11B.

Although the distance W11B and the distance W3B vary depending on the size of the pixels PIX, as an example, the distance W11B is approximately in the range of 20 μm or more and 200 μm or less, and the distance W3B is approximately in the range of 10 μm or greater and 100 μm or less.

Note that the distance W11B may be greater than the distance W3B by an integer multiple, and the integer multiple is not limited to two.

Further, the distance W11B may be smaller than the distance W3B. In this case, in a case where the organic EL display device 1B is curved with the first support member 11B on the inside, a radius of curvature of the organic EL display device 1B curved reduces, and the organic EL display device 1B is easy to curve, as compared with a case where the organic EL display device 1B is curved with the second support member 3B on the inside. As a result, the organic EL display device 1B suitable for applications in which the organic EL display device 1B is often curved with the first support member 11B on the inside can be obtained.

Note that the same applies to the cross sections in the column direction.

On the other hand, the thicknesses at portions in which the bulging portions 3bB of the second support member 3B and the bulging portions 11bB of the first support member 11B overlap with one another are increased. Therefore, sufficient shock resistance and abrasion resistance can be secured.

Then, as illustrated in FIGS. 7A and 7B, since the grooves 11cB, 3cB are arranged in a lattice form extending in the row and column directions, the organic EL display device 1B easy to curve in the row and column directions can be obtained.

Moreover, as illustrated in FIG. 7A, the same number of the bulging portions 3bB overlaps with each of the pixels PIX, and the shapes of the plurality of the bulging portions 3bB overlapping with each of the pixels PIX are the same. In other words, the shapes of the grooves 3cB overlapping with each of the pixels PIX are the same.

Further, as illustrated in FIG. 7B, the same number of the bulging portions 11bB overlaps with each of the pixels PIX, and the shapes of the plurality of the bulging portions 11bB overlapping with each of the pixels PIX are the same. In other words, the shapes of the grooves 11cB overlapping with each of the pixels PIX are the same.

Therefore, even though the grooves 3cB, 11cB overlap with the pixels PIX, the grooves 3cB, 11cB are difficult for an observer to view. Therefore, reduction in quality of a displayed image due to the grooves 3cB, 11cB can be prevented.

Note that at least portions that are the grooves formed on the member located on the image display surface side among the grooves 3cB formed on the second support member 3B and the grooves 11cB formed on the first support member 11B and that overlap with the pixels PIX may have the same shape.

Moreover, since the plurality of bulging portions 11bB and the plurality of bulging portions 3bB overlap with the pixels PIX, the pixels PIX are also easy to curve. Therefore, a radius of curvature of the organic EL display device 1B curved is reduced, and the organic EL display device 1B easy to curve can be obtained.

Fourth Embodiment

A fourth embodiment of the disclosure will be described below with reference to FIG. 9 and FIGS. 10A and 10B. Note that for convenience of description, members having the same functions as the members described in the first to third embodiments are given the same reference signs, and the description of the members is omitted.

Figure 9:
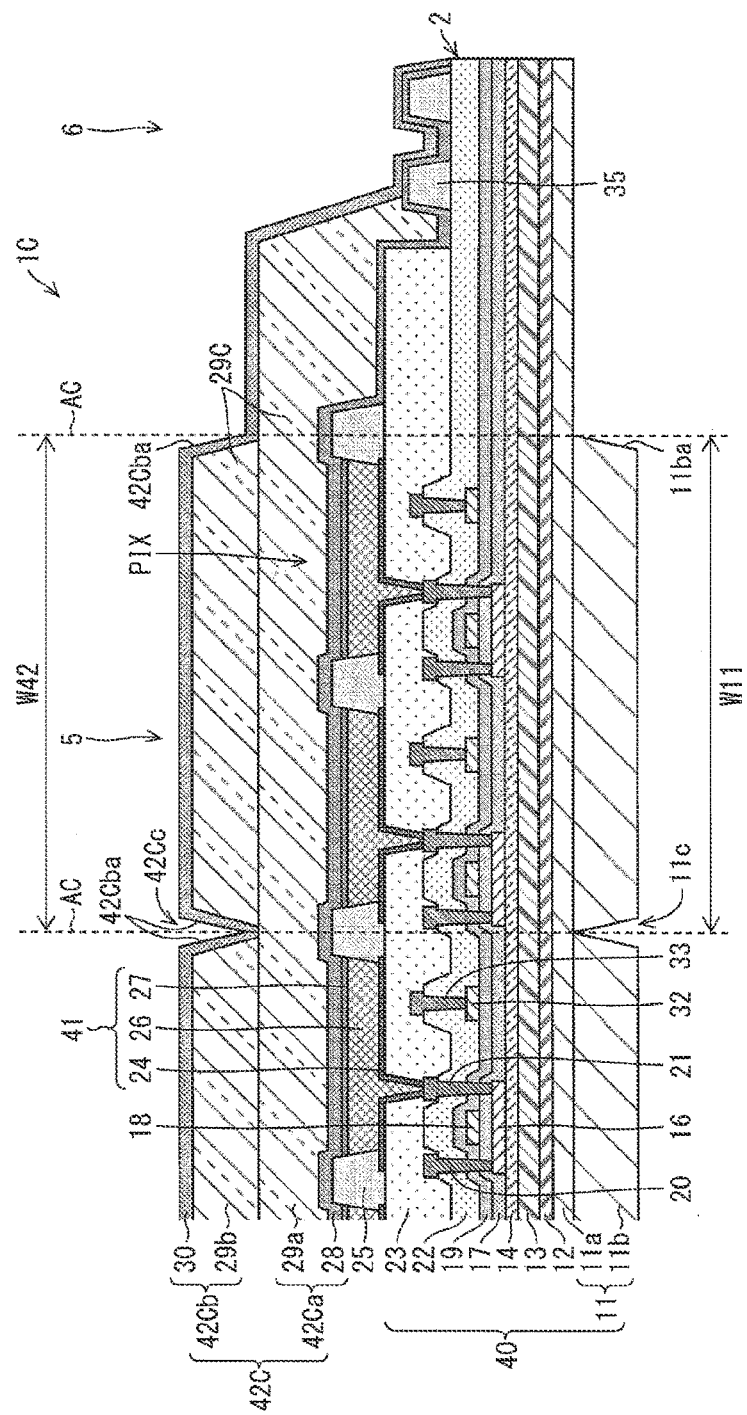
FIG. 9 is a cross-sectional view illustrating a configuration of an organic EL display device according to a fourth embodiment of the disclosure.

FIG. 9 is a cross-sectional view illustrating a configuration of an organic EL display device 1C according to the fourth embodiment of the disclosure. As illustrated in FIG. 9, the organic EL display device 1C is different from the organic EL display device 1 in that the organic EL display device 1C does not include an adhesive layer 4 and a second support member 3, and include a sealing layer 42C including concave-convex portions, instead of the sealing layer 42. The rest of the configuration of the organic EL display device 1C is the same as the configuration of the organic EL display device 1.

Since the organic EL display device 1C is Thin Film Encapsulated (TFE), the second support member 3 may be omitted. As a result, the thickness of the organic EL display device 1C can be reduced, as compared with an organic EL display device including the second support member 3. Note that the organic EL display device 1C may include a touch panel applied to a surface of the sealing layer 42C.

An organic layer 29C includes a leveled portion 29a and a plurality of bulging portions 29b. As an example, the leveled portion 29a can be formed by using the ink-jet method. The plurality of bulging portions 29b can be formed on the leveled portion 29a by, for example, nanoimprinting or the like. The plurality of bulging portions 29b may be formed on the leveled portion 29a by the ink-jet method.

The inorganic layer 30 on the organic layer 29C has a convex-concave shape conforming to the shapes of the plurality of the bulging portions 29b.

In the sealing layer 42C, an inorganic layer 28 and the leveled portion 29a are referred to as a leveled portion 42Ca, and the plurality of bulging portions 29b and the inorganic layer 30 are referred to as a plurality of bulging portions 42Cb.

In other words, the sealing layer 42C includes the leveled portion 42Ca covering the organic EL element 41, and the plurality of bulging portions 42Cb formed on an outside surface opposite to a contact surface with the organic EL element 41 in the leveled portion 42Ca. In other words, the sealing layer 42C includes grooves 42Cc formed between the plurality of bulging portions 42Cb.

In this embodiment, a cross-sectional shape of each of the bulging portions 42Cb is a trapezoidal shape. Then, a shape of each of the grooves 42Cc is a V shape. Note that the cross-sectional shape of each of the bulging portions 42Cb is not limited to a trapezoidal shape, and various shapes can be adopted, such as a semi-circular shape, a triangular shape, a square shape, or a polygonal shape other than a square shape.

The bulging portions 42Cb cover pixels PIX from above. In this embodiment, side surfaces 42Cba of the bulging portions 42Cb adjacent to each other are in contact with each other. Note that the side surfaces 42Cba of each of the bulging portions 42Cb may be separated from each other.

The grooves 42Cc that are recessed portions between the bulging portions 42Cb adjacent to each other are located above the separation layer 25,
and are not disposed above the pixels PIX.

Figure 10A:
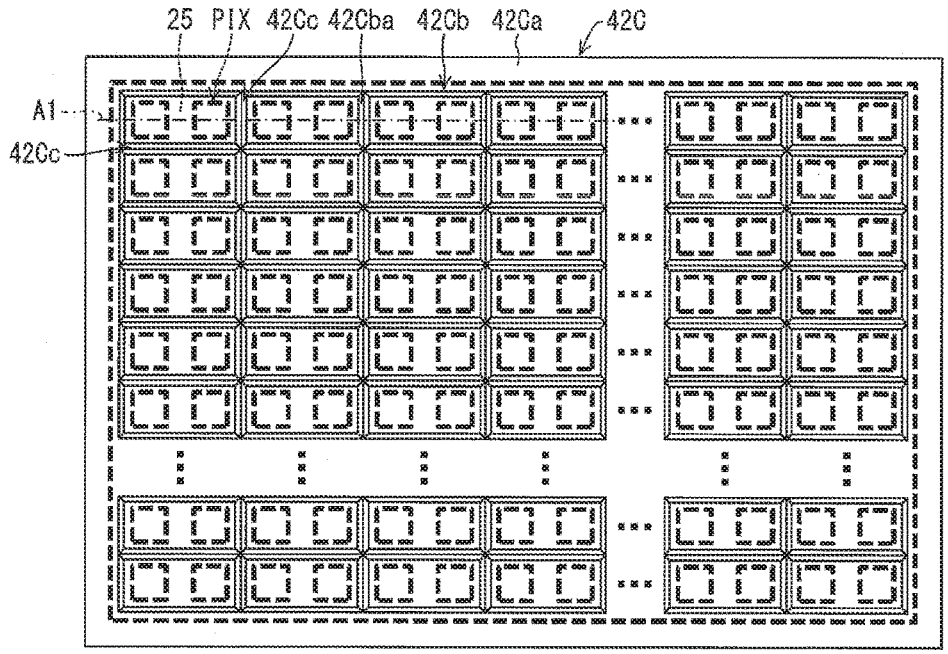
FIG. 10A is a plan view illustrating a configuration of a sealing layer of the organic EL display device.
Figure 10B:
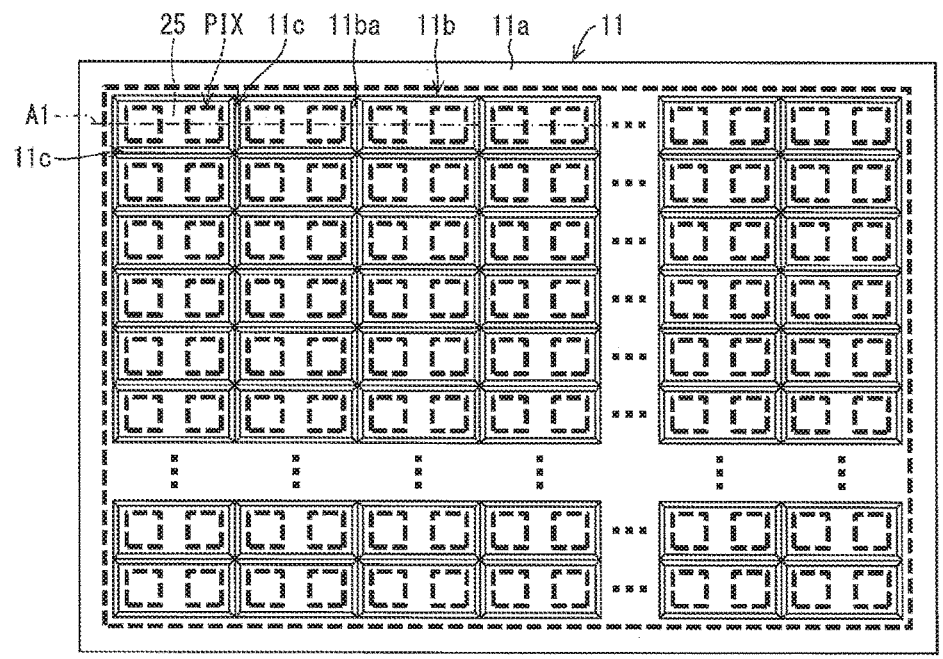
FIG. 10B is a plan view illustrating a configuration of a support member of the organic EL display device.

FIG. 10A is a plan view illustrating a configuration of the sealing layer 42C, and FIG. 10B is a plan view illustrating a configuration of a first support member 11.

As illustrated in FIGS. 10A and 10B, the bulging portions 42Cb of the sealing layer 42C are formed in a matrix form on an outside surface opposite to a contact surface with an intermediate member (member between the sealing layer 42C and the first support member 11) in the sealing layer 42C. Therefore, the grooves 42Cc between the bulging portions 42Cb are formed in a lattice form on the outside surface of the sealing layer 42C.

As illustrated in FIG. 9 and FIGS. 10A and 10B, bulging portions 11b of the first support member 11 are formed to overlap with the bulging portions 42Cb of the sealing layer 42C. Moreover, grooves 11c of the first support member 11 are formed to overlap with the grooves 42Cc of the sealing layer 42C.

Thus, the grooves 42Cc, 11c are formed on the outside surfaces of both the first support member 11 and the sealing layer 42C sandwiching the pixels PIX.

When the organic EL display device 1C is curved, for example, with the sealing layer 42C on the inside, a distance between the side surfaces 42Cba of the grooves 42Cc on the inside reduces, and a distance between the side surfaces 11ba of the grooves 11c on the outside increases. Thus, in the organic EL display device 1C, the grooves 11c, 42Cc are formed on both the outside surface of the first support member 11 and the outside surface of the sealing layer 42C sandwiching the intermediate member (member between the sealing layer 42C and the first support member 11) including the pixels PIX, and therefore, flexibility (ease of curving) can be enhanced, as compared with a configuration in which the grooves are not formed on the respective outside surfaces.

Then, since the plurality of bulging portions 11b is formed on the first support member 11 and the plurality of bulging portions 42Cb is formed on the sealing layer 42C, sufficient shock resistance and abrasion resistance can be secured.

Thus, both enhancement of flexibility and suppression of reduction in shock resistance are achieved in the organic EL display device 1C using Thin Film Encapsulation (TFE).

Moreover, as illustrated in FIG. 9 and FIGS. 10A and 10B, in the organic EL display device 1C, the grooves 42Cc of the sealing layer 42C and the grooves 11c of the first support member 11 overlap with one another with the intermediate member interposed between the sealing layer 42C and the first support member 11, as indicated by a broken line AC in FIG. 9. Therefore, the thicknesses at portions in which the grooves 42Cc and the grooves 11c overlap with one another is reduced, and flexibility can be enhanced as compared with a case where the grooves do not overlap with one another.

As illustrated in FIG. 9, a distance (width of each of the bulging portions 11b) W11 between the grooves 11c adjacent to each other and a distance (width of each of the bulging portions 42Cb) W42 between the grooves 42Cc adjacent to each other are equal. In other words, the distance W11 is an integer multiple of the distance W42. In this embodiment, the distance W11 is equal to the distance W42, and the integer multiple is one.

Therefore, the organic EL display device 1C is easy to curve in any of a case where the organic EL display device 1C is curved with the sealing layer 42C on the inside and a case where the organic EL display device 1C is curved with the first support member 11 on the inside. Thus, the organic EL display device 1C having favorable ease-of-use and high convenience can be obtained.

On the other hand, the thicknesses at portions in which the bulging portions 42Cb of the sealing layer 42C and the bulging portions 11b of the first support member 11 overlap with one another is increased. Therefore, sufficient shock resistance and abrasion resistance can be secured.

Note that one of the distance (width of each of the bulging portions 11b) W11 between the grooves 11c adjacent to each other and the distance (width of each of the bulging portions 42Cb) W42 between the grooves 42Cc adjacent to each other may be an integer multiple of the other, and the integer multiple is not limited to one.

Then, as illustrated in FIG. 9 and FIGS. 10A and 10B, the bulging portions 42Cb of the sealing layer 42C cover the plurality of pixels PIX from above. As an example, in this embodiment, each of bulging portions 42Cb of the sealing layer 42C covers two pixels PIX from above. Then, the grooves 42Cc are disposed above an area between the pixels PIX (separation layer 25 (see FIG. 1)), and are not disposed above the pixels PIX.

As a result, it is possible to prevent light emitted from an organic EL layer 26 from being diffused by the grooves 42Cc or the grooves 11c. Therefore, reduction in the quality of a displayed image due to the grooves 42Cc or the grooves 11c can be prevented. In addition, both enhancement of flexibility and suppression of reduction in shock resistance can also be achieved.

Note that among the grooves 42Cc formed on the sealing layer 42C and the grooves 11c formed on the first support member 11, at least the grooves formed on the member located on the image display surface side may overlap with an area between the pixels PIX (in other words, the separation layer 25), and may not overlap with the pixels PIX.

As an example, in this embodiment, each of the bulging portions 42Cb of the sealing layer 42C covers two pixels PIX from above. However, the number of the pixels PIX covered by each of the bulging portions 42Cb from above is not limited to two, and may be one, or three or more.

Moreover, as illustrated in FIGS. 10A and 10B, the grooves 11c, 42Cc extend in row and column directions. As a result, the organic EL display device 1C easy to curve in the row and column directions can be obtained.

Note that planar shapes of the bulging portions 42Cb and the grooves 42Cc of the sealing layer 42C may be the same as the planar shapes of the bulging portions 3bA and the grooves 3cA of the second support member 3A illustrated in FIG. 5A, or may be the same as the planar shapes of the bulging portions 3bB and the grooves 3cB of the second support member 3B illustrated in FIG. 7A. Moreover, planar shapes of the bulging portions 11b and the grooves 11c of the first support member 11 may be the same as the planar shapes of the bulging portions 11bA and the grooves 11cA of the first support member 11A illustrated in FIG. 5B, or may be the same as the planar shapes of the bulging portions 11bB and the grooves 11cB of the first support member 11B illustrated in FIG. 7B.

Supplement

According to a first aspect of the disclosure, the organic EL display device 1 includes: the first support member 11 having flexibility; the organic EL layer 26 formed in a matrix form on the first support member 11; and the second support member 3 having flexibility and disposed opposite the first support member 11 with the organic EL layer 26 interposed between the first support member 11 and the second support member 3. In the organic EL display device 1, the first support member 11 and the second support member 3 each include the outside surface on which the plurality of bulging portions 11b, 3b is formed, and the grooves 11c between the bulging portions 11b of the first support member 11 and the grooves 3c between the bulging portions 3b of the second support member 3 overlap with one another.

According to the above configuration, the grooves between the bulging portions are formed on the outside surfaces of both the first support layer 11 and the second support layer 3. As a result, flexibility (ease of curving) can be enhanced as compared with a configuration in which the grooves are not formed on the respective outside surfaces. Then, sufficient shock resistance can be secured by the plurality of bulging portions formed on the outside surfaces of both the first support member 11 and the second support member 3.

Further, since the grooves on the first support member and the grooves on the second support member overlap with one another, curving is easy. Therefore, flexibility can be enhanced as compared with a configuration in which the grooves do not overlap with one another. Moreover, according to the above configuration, the bulging portions of the first support member and the bulging portions of the second support member overlap with one another. Therefore, reduction in shock resistance can also be suppressed.

Thus, according to the above configuration, both enhancement of flexibility and suppression of reduction in shock resistance can be achieved.

According to a second aspect of the disclosure, in the organic EL display device 1 according to the first aspect, one of the distance between the grooves 11c adjacent to each other on the first support member 11 and the distance between the grooves 3c adjacent to each other on the second support member 3 may be an integer multiple of the other.

According to the above configuration, since the grooves on the first support member and the grooves on the second support member overlap with one another, curving is easy. Moreover, one of the first support member and the second support member that has the shorter distance between the grooves has the number of grooves larger than the other. As a result, an organic EL display device easy to curve with one of the first support member and the second support member that has the larger number of grooves, on the inside can be obtained.

According to a third aspect of the disclosure, in the organic EL display device 1 according to the second aspect, the distance between the grooves 11c adjacent to each other on the first support member 11 and the distance between the grooves 3c adjacent to each other on the second support member 3 may be equal.

According to the above configuration, an organic EL display device easy to curve with any of the first support member and the second support member on the inside can be obtained.

According to a fourth aspect of the disclosure, in the organic EL display device 1 according to the first to third aspects, the grooves formed on one of the first support member 11 and the second support member 3 that is located on an image display surface side may overlap with an area between the pixels PIX on which the organic EL layer 26 is disposed, and may not overlap with the pixels PIX. According to the above configuration, reduction in quality of a displayed image due to the grooves can be prevented.

According to a fifth aspect of the disclosure, in the organic EL display device 1 according to the fourth aspect, among each of the bulging portions 11b of the first support member 11 and each of the bulging portions 3b of the second support member 3, each of the bulging portions of at least one of the first support member 11 and the second support member 3 may overlap with at least one of the pixels PIX.

According to the above configuration, high stiffness of the pixels PIX can be achieved, as compared with the case where the bulging portions do not overlap with at least one of the pixels PIX. As a result, occurrence of faults in electrodes or the like disposed in the pixels PIX can be prevented. Therefore, an image display device with high durability can be obtained.

According to a sixth aspect of the disclosure, in the organic EL display device 1B according to the second to fifth aspects, the distance between the grooves formed on one of the first support member and the second support member that is located on the image display surface side is preferably an integer multiple of the pitch of the pixels.

According to a seventh aspect of the disclosure, in the organic EL display device 1B according to the first to third aspects, the grooves formed on one of the first support member 11B and the second support member 3 that is located on the image display surface side may overlap with the pixels PIX on which the organic EL layer is disposed, and the shapes of the grooves overlapping with the pixels PIX may be the same.

According to the above configuration, even though the grooves overlap with the pixels PIX, the grooves are difficult for an observer to view. Therefore, reduction in quality of a displayed image due to the grooves can be prevented.

According to an eighth aspect of the disclosure, in the organic EL display device 1B according to the seventh aspect, a plurality of the bulging portions formed on one of the first support member 11B and the second support member 3 that is located on the image display surface side may overlap with the pixels PIX. According to the above configuration, the pixels are also easy to curve. Therefore, a radius of curvature of an organic EL display device curved reduces, and the organic EL display device easy to curve can be obtained.

According to a ninth aspect of the disclosure, in the organic EL display device 1B according to the seventh or eighth aspect, the pitch of the pixels may be an integer multiple of the distance between the grooves formed on one of the first support member and the second support member that is located on the image display surface side.

According to a tenth aspect of the disclosure, the method of manufacturing the organic EL display device 1 includes a support member disposing step of disposing the first support member 11 and the second support member 3 each having flexibility, opposite each other with the organic EL layer 26 formed in a matrix form and interposed between the first support member 11 and the second support member 3. In the support member disposing step, the plurality of bulging portions 11b formed on one surface of the first support member 11 and the plurality of bulging portions 3b formed on one surface of the second support member 3 each face toward the outside, and the first support member 11 and the second support member 3 are disposed opposite each other with the grooves 11c formed between the bulging portions 11b of the first support member 11 and the grooves 3c formed between the bulging portions 3b of the second support member 3 overlapping with one another.

According to the above configuration, an organic EL display device in which both enhancement of flexibility and suppression of reduction in shock resistance are achieved can be obtained.

According to an eleventh aspect of the disclosure, the organic EL display device 1C includes: the support member (first support member 11) having flexibility; the organic EL layer 26 formed in a matrix form on the support member (first support member 11); and the sealing layer 42C formed on the support member (first support member 11) and configured to seal the organic EL layer 26. In the organic EL display device 1C, the support member (first support member 11) and the sealing layer 42C each include the outside surface on which the plurality of bulging portions 11c, 42c is formed, and the grooves 11c between the bulging portions 11b of the support member (first support member 11) and the grooves 42cC between the bulging portions 42bC of the sealing layer 42C overlap with one another. According to the above configuration, an organic EL display device in which both enhancement of flexibility and suppression of reduction in shock resistance are achieved can be obtained.

The disclosure is not limited to each of the above embodiments, and various modifications can be made within the scope of the claims. Embodiments that can be obtained by appropriately combining technical approaches disclosed in each of the different embodiments also fall within the technical scope of the disclosure. Further, novel technical features can be formed by combining the technical approaches disclosed in each of the embodiments.

REFERENCE SIGNS LIST 1, 1A, 1B Organic EL display device
2 Organic EL substrate
3 Second support member
8 Intermediate member
11, 11A, 11B First support member (support member)
11a Plate-like portion
11b, 11bA, 11bB Bulging portion
12 Adhesive layer
13 Plastic film
24 Lower electrode
25 Separation layer
26 Organic EL layer
27 Upper electrode
28, 30 Inorganic layer
29 Organic layer
29a, 42, 42a Leveled portion
29b Bulging portion
40 TFT substrate
42, 42A, 42B Sealing layer
42c, 42cA, 42cB Bulging portion

The invention claimed is:

1. An organic EL display device, comprising:
a first support member having flexibility;
an organic EL layer formed in a matrix form on the first support member; and
a second support member having flexibility and disposed opposite the first support member with the organic EL layer interposed between the first support member and the second support member,
wherein the first support member and the second support member each include an outside surface on which a plurality of bulging portions is formed,
grooves between the bulging portions of the first support member and grooves between the bulging portions of the second support member overlap with one another,
the grooves formed on one of the first support member and the second support member that is located on an image display surface side overlap with pixels on which the organic EL layer is disposed, and shapes of the grooves overlapping with the pixels are the same, and
a pitch of the pixels is an integer multiple of a distance between the grooves formed on one of the first display member and the second display member that is located on the image display surface side.

2. The organic EL display device according to claim 1, wherein a plurality of the bulging portions formed on one of the first support member and the second support member that is located on the image display surface side overlap with the pixels.

3. The organic EL display device according to claim 1, wherein one of a distance between the grooves adjacent to each other on the first support member and a distance between the grooves adjacent to each other on the second support member is an integer multiple of the other.

4. The organic EL display device according to claim 3, wherein a plurality of the bulging portions formed on one of the first support member and the second support member that is located on the image display surface side overlap with the pixels.

5. The organic EL display device according to claim 3, wherein the distance between the grooves adjacent to each other on the first support member and the distance between the grooves adjacent to each other on the second support member are equal.

6. The organic EL display device according to claim 5, wherein a plurality of the bulging portions formed on one of the first support member and the second support member that is located on the image display surface side overlap with the pixels.

\* \* \* \* \*